United States Patent [19]

Shimaoka et al.

[11] Patent Number: 4,704,525
[45] Date of Patent: Nov. 3, 1987

[54] CONSTRUCTION FOR POSITIONING PHOTOSENSOR DEVICES

[75] Inventors: Motohiro Shimaoka; Yukio Saito, both of Furukawa, Japan

[73] Assignee: Alps Electric Co., Ltd., Japan

[21] Appl. No.: 898,724

[22] Filed: Aug. 14, 1986

Related U.S. Application Data

[63] Continuation of Ser. No. 566,342, Dec. 28, 1983, abandoned.

[30] Foreign Application Priority Data

Dec. 28, 1982 [JP] Japan .................................. 57-195826

[51] Int. Cl.⁴ .............................................. H01J 5/02
[52] U.S. Cl. ................................................... 250/239
[58] Field of Search ................. 250/239, 221, 231 SE; 350/167, 416

[56] References Cited

U.S. PATENT DOCUMENTS

| 2,918,584 | 12/1959 | Edsberg et al. | 250/239 |
| 3,390,388 | 6/1968 | Kahl, Jr. et al. | 250/221 |
| 3,535,528 | 10/1970 | Strickland | 250/221 |
| 3,619,629 | 11/1971 | Matthews | 250/239 |
| 4,291,346 | 9/1981 | Beecroft et al. | |
| 4,326,128 | 4/1982 | Klein | 250/231 SE |
| 4,331,868 | 5/1982 | Mash | 250/239 |
| 4,375,592 | 3/1983 | Cox et al. | 250/231 SE |

FOREIGN PATENT DOCUMENTS

| 1403327 | 5/1965 | France | 250/239 |
| 0559500 | 2/1975 | Switzerland | 250/239 |

Primary Examiner—Edward P. Westin
Attorney, Agent, or Firm—Guy W. Shoup

[57] ABSTRACT

A construction for positioning photosensor devices, comprises an attachment having a circular hole, a first photosensor device such as a light-emitting element including a substantially semispherical body having a maximum diameter slightly larger than the diameter of the circular hole, a second photosensor device such as a photodetector element disposed in confronting relation to the circular hole, the semispherical body being partly fitted in the circular hole, thereby providing coaxial alignment between the first and second photosensor devices.

3 Claims, 2 Drawing Figures

CONSTRUCTION FOR POSITIONING PHOTOSENSOR DEVICES

This is a continuation application from application Ser. No. 566,342 filed Dec. 28, 1983, now abandoned.

BACKGROUND OF THE INVENTION

The present invention relates to a construction for positioning photosensor devices including coacting LEDs and phototransistors, and more particularly to a construction for positioning a so-called side-view type LED or phototransistor having a light-emitting device or photodetector device in the shape of a semispherical body projecting on the coacting device.

It is most important with this type of photosensor that the confronting devices (an LED and a phototransistor, for example) be positionally aligned for optical axis alignment. Accordingly, positioning the photosensor devices, that is, centering the confronting devices for optical axis alignment, is an essential task to be performed.

There have heretofore been no effective positioning or centering means for positioning one device having a projecting semispherical body in confronting relation to the coacting device. If the confronting devices are placed out of alignment with each other, then the photosensor which is particularly of high directivity is highly liable to malfunction. It has been difficult to position a plurality of photosensor devices in alignment efficiently and accurately.

SUMMARY OF THE INVENTION

With the foregoing problem in view, it is an object of the present invention to provide a construction for positioning photosensor devices in coaxial alignment efficiently and accurately.

According to the present invention, there is provided a construction for positioning photosensor devices, comprising an attachment having a circular hole, a first device such as a light-emitting element including a substantially semispherial body having a maximum diameter slightly larger than the diameter of the circular hole, a second device such as a photodetector element disposed in confronting relation to the circular hole, the semispherical body being partly fitted in the circular hole, thereby providing automatic coaxial alignment between the first and second devices.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
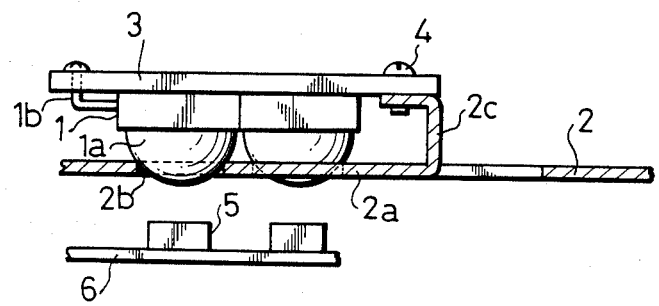
FIG. 1 is a side elevational view, partly in cross section, of a plurality of photosensor devices mounted on an attachment.

As shown in FIG. 1, two LED devices 1 comprising LEDs are mounted on an attachment 2. Each of the LED devices 1 comprises a semispherical body 1a of glass containing a light-emitting element and a lead wire 1b soldered to a printed-circuit board 3.

The semispherical bodies 1a are fitted in circular holes 2b, respectively, defined in a flat area 2a of the attachment 2. The printed-circuit board 3 is fixed by screws 4 to a support 2c raised by slitting the attachment 2. Each of the holes 2b has a diameter slightly smaller than the maximum diameter of the corresponding semispherical body 1a. Therefore, the semispherical body 1a is partly fitted in the corresponding hole 2b. When the semispherical body 1a is inserted into the hole 2b, the LED devices 1 are pressed down with small forces applied in parallel to bring themselves into central alignment with the respective holes 2b for thereby centering the LED devices 1. With the photosensor devices 1 thus attached to the attachment 2, they are positioned and centered accurately with respect to the holes 2b. Phototransistors 5 are mounted on a board 6 below the holes 2b, respectively, in alignment with the LED devices 1 in confronting relationship.

By locating the attachment 2 with the holes 2b aligned with the phototransistors 5, respectively, the LED devices 1 can be positioned properly with a high degree of efficiency and accuracy.

Figure 2:
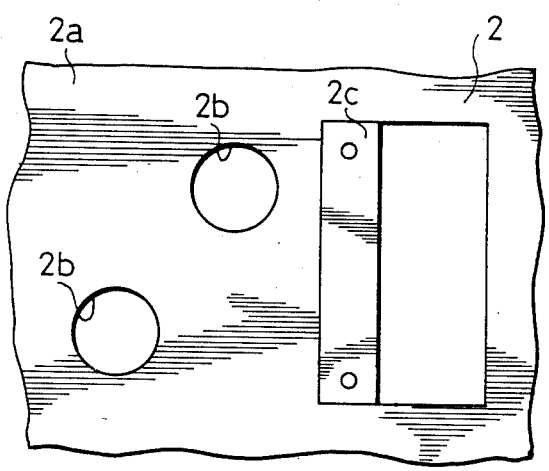
FIG. 2 is a fragmentary plan view of the attachment shown in FIG. 1.

FIG. 2 shows in plan view the attachment 2 with the holes 2b defined in the flat area 2a thereof.

With the arrangement of the present invention, as many LED devices as desired can accurately and easily be positioned in coaxial alignment with corresponding phototransistors by providing a corresponding number of holes in the attachment.

Although a certain preferred embodiment has been shown and described, it should be understood that many changes and modifications may be made therein without departing from the scope of the appended claims.

What is claimed is:

1. A construction for positioning photosensor devices of the type having a light-emitting element coacting with a light-receiving element, at least one of the coacting elements having a semispherical body of a maximum diameter, comprising:
   (a) a positioning plate having a circular hole of a diameter slightly smaller than the diameter of said semispherical body of said one element;
   (b) a support plate parallel to the positioning plate on one side thereof for mounting said one element such that said semispherical body is pressed and fitted in said circular hole of said positioning plate; and
   (c) the other of said coacting elements being disposed in confronting relation to said circular hole on the other side of said positioning plate, so as to provide coaxial alignment between said coacting elements; wherein said support plate is a printed circuit board mounted in relation to said positioning plate by a portion of said positioning plate being cut and bent upwardly to form a raised support for mounting said printed circuit board, said one element being mounted to said printed circuit board which is then mounted to the raised support portion of said positioning plate with the semispherical body of said one element pressed into the aligning hole of said positioning plate and having a lead thereof soldered to said printed circuit board.

2. A construction according to claim 1, wherein said light-receiving elements is a photodetector element.

3. A construction according to claim 1, adapted for a plurality of photosensor devices comprising pairs of coacting elements, wherein said positioning plate has a corresponding plurality of circular holes and each said one element of said pairs of coacting elements being mounted on said support plate pressed and fitted into a corresponding one of said circular holes, and each of the other element of said pairs of coacting elements being disposed in confronting relation correspondingly to said circular holes.

* * * * *